United States Patent
Hase et al.

[11] Patent Number: 5,849,211
[45] Date of Patent: Dec. 15, 1998

[54] PIEZOELECTRIC CERAMIC COMPOSITIONS

[75] Inventors: Kiyoshi Hase, Ishikawa-ken; Kosuke Shiratsuyu; Kunisaburo Tomono, both of Otsu, all of Japan

[73] Assignee: Murata Manufacturing Co., Ltd., Kyoto-fu, Japan

[21] Appl. No.: 563,216

[22] Filed: Nov. 27, 1995

[30] Foreign Application Priority Data

Nov. 28, 1994 [JP] Japan ................................. 6-319319

[51] Int. Cl.$^6$ ..................... C04B 35/491; C04B 35/493; C04B 35/49
[52] U.S. Cl. .................... 252/62.9 PZ; 501/134; 501/135
[58] Field of Search ..................... 252/62.9 PZ; 501/134, 501/135

[56] References Cited

U.S. PATENT DOCUMENTS

| | | | |
|---|---|---|---|
| 3,268,453 | 8/1966 | Ouchi et al. ..................... | 252/62.9 PZ |
| 3,449,253 | 6/1969 | Hayakawa et al. ............... | 252/62.9 PZ |

FOREIGN PATENT DOCUMENTS

| | | |
|---|---|---|
| 0344000A3 | 11/1989 | European Pat. Off. . |
| 0344978A3 | 12/1989 | European Pat. Off. . |
| 42-9716 | 5/1970 | Japan . |
| 63-80410 | 4/1988 | Japan . |
| 429716 | 5/1997 | Japan . |

OTHER PUBLICATIONS

Patent Abstracts of Japan, vol. 016, No. 022 (E–1156), Jan. 20, 1992; & JP–A–03–23881 (Nippon Cement Co., Ltd.). Oct. 24, 1991.

Patent Abstracts of Japan,. vol. 016, No. 204 (E–1202), May 15, 1992; & JP–A–56–001587 (Matsushita Electric Ind. Co., Ltd.). Jan. 9, 1981.

Patent Abstracts of Japan, vol. 005, No. 051 ( E–051), Apr. 10, 1981; & JP–A–56–001587 (Matsushita Electric Ind. Co., Ltd.). Jan. 9, 1981.

*Primary Examiner*—Melissa Bonner
*Attorney, Agent, or Firm*—Ostrolenk, Faber, Gerb & Soffen, LLP

[57] ABSTRACT

A three-component piezoelectric ceramic composition having a large electro-mechanical coupling coefficient and high mechanical strength, composed of $xPb(Mg_{w/3}Nb_{1-w/3})O_3$-$yPbZrO_3$-$zPbTiO_3$, is adapted so as to place points representing the compositional proportions x, y, and z (x+y+z=1) on lines connecting points A: (x=0.70, y=0.01, z=0.29),
B: (x=0.50, y=0.01, z=0.49),
C: (x=0.05, y=0.40, z=0.55), and
D: (x=0.05, y=0.65, z=0.30)

and in the compositional region bounded by the lines in a three-component composition diagram and the value of w in the range from 0.8 to 1.

10 Claims, 1 Drawing Sheet

PIEZOELECTRIC CERAMIC COMPOSITIONS

BACKGROUND OF THE INVENTION

The present invention relates to a piezoelectric ceramic composition used for filters and electrostriction elements.

Due to their large electro-mechanical coupling coefficient and high temperature stability, $Pb(Mg_{1/3}Nb_{2/3})O_3$-$PbZrO_3$-$PbTiO_3$-based piezoelectric ceramics (PMN-PZ-PT), obtained by dissolving $Pb(Mg_{1/3}Nb_{2/3})O_3$ in $Pb(Zr, Ti)O_3$, a typical type of piezoelectric ceramics, are widely used for filters and electrostriction elements (JP-B-42-9716).

Not all PMN-PZ-PT-based piezoelectric ceramics, however, have satisfactory mechanical strength and thus may crack or chip when machined into a piezoelectric element.

According to the present invention a piezoelectric ceramic composition is provided which has a large electro-mechanical coupling coefficient and offers high temperature stability and improved mechanical strength, thereby solving the above-described problem.

SUMMARY OF THE INVENTION

A piezoelectric ceramic composition for the purpose of the specification is a three-component system composed of $xPb(Mg_{w/3}Nb_{1-w/3})O_3$-$yPbZrO_3$-$zPbTiO_3$, wherein points representing the compositional proportions x, y, and z (x+y+z=1) are substantially on lines connecting points A: (x=0.70, y=0.01, z=0.29),
B: (x=0.50, y=0.01, z=0.49),
C: (x=0.05, y=0.40, z=0.55), and
D: (x=0.05, y=0.65, z=0.30)

and are in the compositional region bounded by the lines in the three-component composition diagram of FIG. 1. The value of w preferably ranges from about 0.8 to 1.

In other words, a PMN-PZ-PTi-based piezoelectric ceramic composition of the present invention is characterized in that the Mg-Nb ratio thereof is substantially less than the stoichiometric ratio of 1/2.

The piezoelectric ceramic composition is also characterized by up to fifteen molar percent of Pb atoms being replaced by atoms of at least one type of element, selected from a group of Ca, Sr and Ba.

Reducing the ratio of Mg to Nb to below the stoichiometric ratio of about 1/2 causes the diameter of particles constituting the ceramic to be reduced and the mechanical strength thereof to be increased.

What is more, the increased mechanical strength does not adversely effect the electro-mechanical coupling coefficient.

DETAILED DESCRIPTION OF THE PREFERRED EMBODIMENTS

Figure 1:
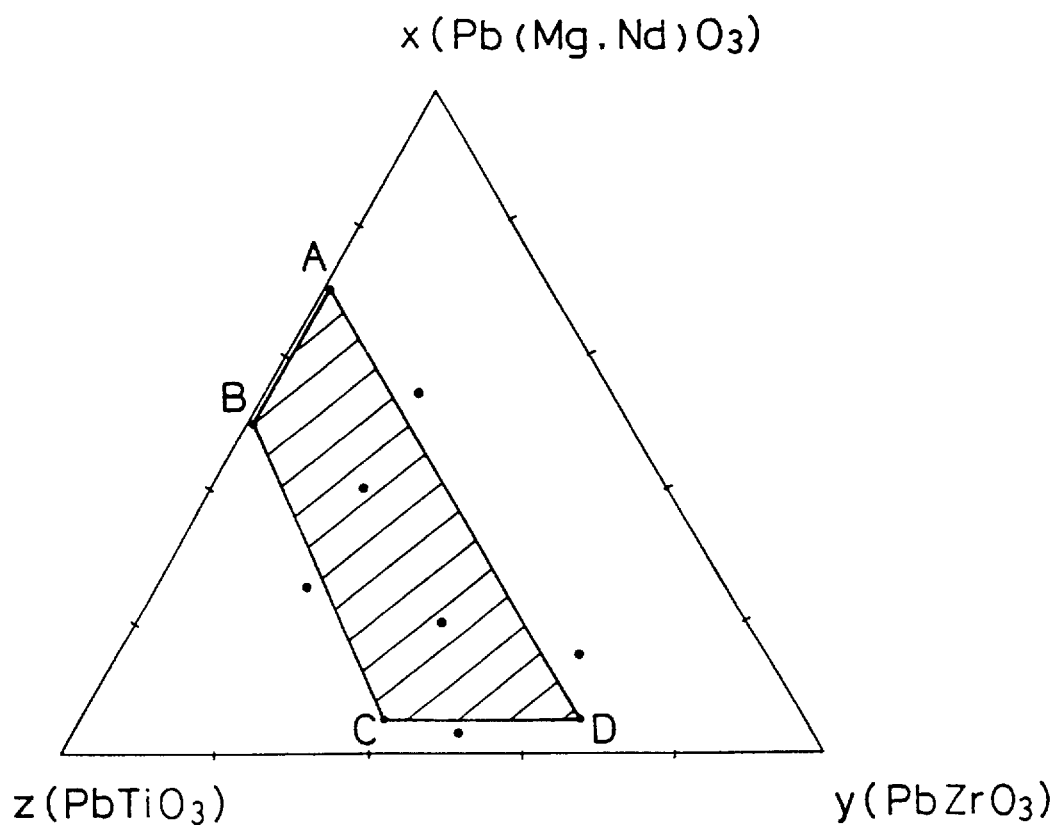
FIG. 1 is a three-component composition diagram showing the proportions of the components of a piezoelectric ceramic (PMN-PZ-PT) composition of the present invention.

Referring now to preferred embodiments, advantages of the present invention are specifically described below.

A predetermined amount of components of a piezoelectric ceramic composition, such as PbO, $TiO_2$, $ZrO_2$, $SrCO_3$, $CaCO_3$, $BaCo_3$, $MgCO_3$, and $Nb_2O_5$, was measured, water was added to the measured substances, and the combination was mixed using a ball mill.

The resulting mixture was dried, incompletely calcined at preferably 700° to 900° C. for two hours, and water-ground using a ball mill to obtain an adjusted powder.

Binders, such as water and polyvinyl alcohol, were added to the resulting adjusted powder, and then the mixture was pressed and sintered at about 1100° to 1300° C. for about two hours to obtain piezoelectric ceramics of predetermined composition.

The piezoelectric ceramics were worked to prepare samples for three-point bending strength testing and electrical characteristic measurements. Samples for three-point bending strength testing were prepared by forming some of the piezoelectric ceramics into 30 mm×5 mm×0.3 mm rectangles. Samples for electrical characteristic measurements were prepared by forming the remaining piezoelectric ceramics into disks 10 mm in diameter and 1 mm thick, polishing the disks, applying silver electrodes onto both sides of the disks by baking, and polarizing the disks in insulating oil at 80° C. for 30 minutes with an electric field with a strength of 2 to 3 kV/mm imposed on the oil.

Comparison samples were formed from piezoelectric ceramics compositions outside the scope of the present invention in the same way as the samples of the above embodiments.

The above-described samples of the embodiments and the comparison samples underwent three-point bending strength testing and measurements of the electro-mechanical coupling coefficient for vibration in a radius direction. The results are shown in Table 1.

TABLE 1

| Sample No. | x | y | z | w | A | a | Three-point strength (kgf/cm$^2$) | Electro-mechanical coupling coefficient Kp (%) |
|---|---|---|---|---|---|---|---|---|
| *1 | 0.55 | 0.20 | 0.25 | 0.95 | Sr | 0.02 | 1160 | 19.1 |
| 2  | 0.40 | 0.20 | 0.40 | 0.95 | Sr | 0.02 | 1140 | 64.1 |
| *3 | 0.25 | 0.20 | 0.55 | 0.95 | Sr | 0.02 | 1120 | 16.3 |
| 4  | 0.20 | 0.40 | 0.40 | 0.95 | Sr | 0.02 | 1110 | 60.9 |
| *5 | 0.15 | 0.60 | 0.25 | 0.95 | Sr | 0.02 | 1070 | 21.6 |
| *6 | 0.03 | 0.50 | 0.47 | 0.95 | Sr | 0.02 | 900  | 47.4 |
| *7 | 0.40 | 0.20 | 0.40 | 1.00 | Sr | 0.02 | 930  | 67.9 |
| 8  | 0.40 | 0.20 | 0.40 | 0.85 | Sr | 0.02 | 1210 | 50.4 |

TABLE 1-continued

| Sample No. | x | y | z | w | A | a | Three-point strength (kgf/cm$^2$) | Electro-mechanical coupling coefficient Kp (%) |
|---|---|---|---|---|---|---|---|---|
| *9 | 0.40 | 0.20 | 0.40 | 0.80 | Sr | 0.02 | 1250 | 20.3 |
| *10 | 0.03 | 0.50 | 0.47 | 0.85 | Sr | 0.02 | 940 | 43.1 |
| 11 | 0.20 | 0.40 | 0.40 | 0.95 | — | — | 1100 | 61.3 |
| 12 | 0.20 | 0.40 | 0.40 | 0.95 | Sr | 0.04 | 1110 | 48.1 |
|  |  |  |  |  | Ba | 0.04 |  |  |
|  |  |  |  |  | Ca | 0.04 |  |  |
| *13 | 0.20 | 0.40 | 0.40 | 0.95 | Sr | 0.20 | 1100 | 28.2 |

In Table 1, symbols x, y, z, and w represent the molar proportions of components of $xPb(Mg_{w/3}Nb_{1-w/3})O_3$-$yPbZrO_3$-$zPbTiO_3$, and symbols A and a represent the element replacing Pb (i.e., Sr, Ba, or Ca) and the molar percentage of that element, respectively.

The asterisked marked sample numbers in the table indicate piezoelectric ceramics outside the scope of the present invention (comparison samples).

As shown in Table 1, a piece of piezoelectric ceramic (sample No. 7) whose w value is substantially 1 or more was found to be low in three-point bending strength, while a piece of piezoelectric ceramic (sample No. 9) whose w value is substantially 0.8 or less was found to have a low electro-mechanical coupling coefficient Kp.

The electromechanical coupling coefficient Kp was found to be reduced if the percentage of Pb atoms replaced with Ca, Sr, and Ba exceeds 15% (sample No. 13).

The electromechanical coupling coefficient Kp was found to be significantly reduced if the composition of PMN-PZ-PT is not within the scope of the invention (samples No. 1, 3, 5, 6, and 10). Even setting the value of w to below 1 was found to unsatisfactorily improve mechanical strength, particularly if the compositional proportion of PMN, x, is substantially less than 0.05 (samples No. 6 and 10).

It should be understood that the present invention is not limited to the above embodiment and that various modifications can be made to the values of x, y, z, and w and the percentage of Pb atoms to be replaced with Ca, Sr and/or Ba, without departing from the spirit of the invention.

As described above, having a large electromechanical coupling coefficient Kp and high mechanical strength enables a piezoelectric ceramic composition of the present invention to form piezoelectric elements having advantages necessary for filters and electrostriction elements to be produced in high yield by inhibiting the occurrence of defects, such as cracks and chips, during machining operation.

What is claimed is:

1. A three-component piezoelectric ceramic composition of $xPb(Mg_{w/3}Nb_{1-w/3})O_3$-$yPbZrO_3$-$zPbTiO_3$ in which up to about 15 molar percent of said Pb atoms are replaced with atoms of at least one element selected from the group consisting of Ca, Sr and Ba and x+y+z=1, wherein points representing the compositional proportions x, y, and z are on lines connecting points A: (x=0.70, y=0.01, z=0.29),
B: (x=0.50, y=0.01, z=0.49),
C: (x=0.05, y=0.40, z=0.55), and
D: (x=0.05, y=0.65, z=0.30)

or are within the region bounded by those lines in a three-component composition diagram, and the value of w is from about 0.8 to 0.95.

2. The piezoelectric ceramic composition according to claim 1, wherein 0% of said Pb atoms are replaced.

3. The piezoelectric ceramic composition according to claim 1, wherein a part of said Pb is replaced with Sr.

4. The piezoelectric ceramic composition according to claim 3, wherein w is 0.85 to 0.95.

5. The piezoelectric ceramic composition according to claim 1, wherein w is 0.85 to 0.95.

6. The piezoelectric ceramic composition according to claim 1, wherein a part of said Pb is a combination of Ca, Sr and Ba.

7. The piezoelectric ceramic composition according to claim 1, wherein x is 0.20–0.40 and y is 0.20–0.40.

8. The piezoelectric ceramic composition according to claim 7, wherein z is 0.4.

9. The piezoelectric ceramic composition according to claim 8, wherein w is 0.85 to 0.95.

10. The piezoelectric ceramic composition according to claim 9, wherein a part of said Pb is replaced with Sr.

* * * * *